United States Patent [19]

Ohya et al.

[11] Patent Number: 4,874,727

[45] Date of Patent: * Oct. 17, 1989

[54] PARTICULATE LEAD TITANATE CERAMIC AND COMPOSITE MATERIAL CONTAINING SAME

[75] Inventors: Kanji Ohya; Tsutomu Tsunooka; Koji Ogura; Hirofumi Ozeki; Takashi Yamamoto, all of Nagoya, Japan

[73] Assignee: NGK Spark Plug Co., Ltd., Aichi, Japan

[*] Notice: The portion of the term of this patent subsequent to May 10, 2005 has been disclaimed.

[21] Appl. No.: 87,658

[22] Filed: Aug. 20, 1987

[30] Foreign Application Priority Data

Aug. 29, 1986 [JP] Japan ................... 61-204199

[51] Int. Cl.$^4$ ............................................. C04B 35/46
[52] U.S. Cl. ..................................... 501/134; 501/136; 428/137; 428/209; 428/901; 524/413; 252/62.9
[58] Field of Search ............... 501/134, 135, 136, 137, 501/138, 139; 423/598; 252/62.9, 62.9 PZT; 524/413; 428/137, 209, 901

[56] References Cited

U.S. PATENT DOCUMENTS

| 4,243,541 | 1/1981 | Takeuchi et al. | 252/62.9 |
| 4,624,796 | 11/1986 | Giniewicz et al. | 252/62.9 |
| 4,743,392 | 5/1988 | Ozeki et al. | 252/62.9 |

FOREIGN PATENT DOCUMENTS 57-095828 6/1982 Japan ................... 423/598

*Primary Examiner*—William R. Dixon, Jr.
*Assistant Examiner*—Anthony J. Green
*Attorney, Agent, or Firm*—Darby & Darby

[57] ABSTRACT

A particulate lead titanate ceramic obtained by calcining a mixture containing $TiO_2$ and PbO at 1150°–1300° C., the proportion of the PbO being greater than 1 mole per mole of the $TiO_2$. A composite material having the particulate lead titanate ceramic supported in an organic substrate exhibits improved piezoelectric properties and is useful as a piezoelectric element or pyroelectric element.

17 Claims, 6 Drawing Sheets

PARTICULATE LEAD TITANATE CERAMIC AND COMPOSITE MATERIAL CONTAINING SAME

BACKGROUND OF THE INVENTION

This invention relates to a particulate lead titanate ceramic a method of making the ceramic and to composite materials containing the particulate lead titanate ceramic.

Lead titanate ($PbTiO_3$) is a ferroelectric of a perovskite structure and is used in a wide variety of applications as piezoelectric or pyroelectric materials. Due to its higher piezoelectric charge constant $d_h(d_{33}+2d_{31})$ and piezoelectric stress constant $g_h(=d_h/\epsilon)$ in under water conditions as compared with other ferroelectrics such as lead titanate-zirconate, lead titanate attracts particular attention in applications to underwater acoustic transducers such as hydrophones.

There has been an increasing demand for flexible, low density piezoelectric materials which exhibit excellent acoustic matching with water in efficiently receiving or generating acoustic or ultrasonic waves and which have strength sufficient to withstand water pressures in deep sea bottoms. In meeting the above demand, the present inventors have proposed a piezoelectric composite material which includes lead titanate powder dispersed in an organic matrix of a synthetic rubber or synthetic resin (Japanese Laid Open Publication No. 57-87680).

Conventionally, lead titanate powder has been prepared by calcining a mixture of $TiO_2$ and PbO with a predetermined composition at about 1050° C. The lead titanate particles thus obtained have various indeterminate shapes so that they are oriented at random when dispersed in an organic matrix. For this reason, even when an external electrical field is applied to the lead titanate particles for poling thereof and for regularizing their poling directions, parts of them fail to be sufficiently oriented. This adversely affects the piezoelectric properties of the lead titanate powder.

SUMMARY OF THE INVENTION

It is an object of the present invention to provide a novel, particulate lead titanate ceramic which is large in particle size and whose shape is a rectangular parallelepiped.

Another object of the present invention is to provide a composite material whose spontaneous polarization is highly oriented and which contains the above particulate lead titanate ceramic and is suitable for use as piezoelectric or pyroelectric materials.

In accomplishing the foregoing objects, there is provided in accordance with the preset invention a particulate lead titanate ceramic obtained by calcining at a temperature of 1150°–1300° C. a mixture containing $TiO_2$ and PbO, the proportion of the PbO being greater than 1 mole per mole of the $TiO_2$.

In another aspect, the present invention provides a particulate lead titanate ceramic having the formula:

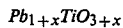

$$Pb_{1+x}TiO_{3+x}$$

wherein x is a number greater than 0, and having the X-ray diffraction pattern shown in any of FIGS. 1(a) through 1(f).

In a further aspect, the present invention provides a compostie material comprising an organic matrix supporting therewithin the above lead titanate particles.

BRIEF DESCRIPTION OF THE DRAWINGS

Other objects, features and advantgesof the present invention will become apparent from the detailed description of the invention which follows when considered in light of the accompanying drawings, in which.

DETAILED DESCRIPTION OF THE INVENTION

The particulate lead titanate ceramic according to the present invention has a large particle size and is crystallographically a rectangular parallelepiped in shape with a developed c-axis.

More specifically, when a mixture of $TiO_2$ and PbO which has a molar ratio of the PbO to the $TiO_2$ of greater than 1, preferably 1.01:1 to 1.08:1, is heated for effecting solid phase reaction at 1150°–1300° C., which is higher by at least about 100° C. than the conventional calcination temperature (1050° C.), and then the reaction mass is rapidly cooled in water or gradually cooled in air, large, rectangular parallelepiped lead titanate ceramic particles of the present invention whose c-axes are markedly developed can be obtained. The c-axis is the same as the direction of the spontaneous polarization. The ceramic of the present invention is discriminated from the conventional lead titanate in characeristic X-ray diffraction patterns as appreciated from FIGS. 1(a) through 1(f) and FIG. 2.

Figure 3:
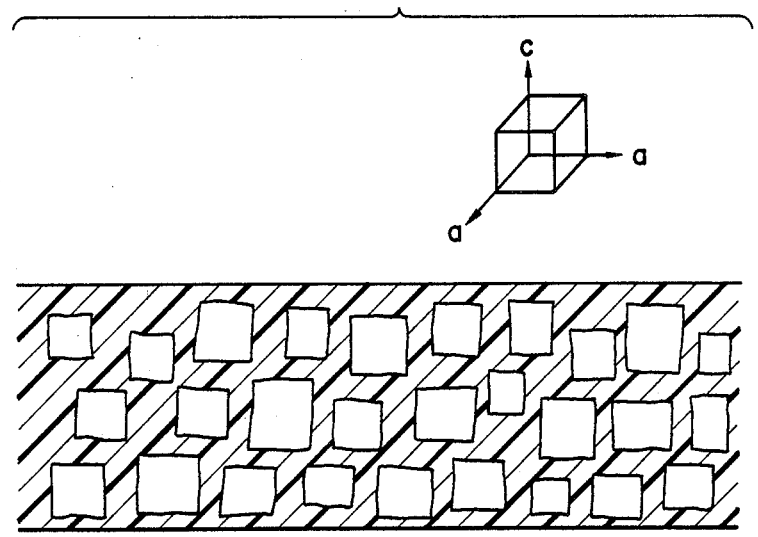
FIG. 3 is a schematic illustration of the configuration of particulate lead titanate cermic according to the present invention dispersed in an organic matrix.

When the particulate lead titanate ceramic according to the present invention is composited with an organic matrix by dispersion thereinto, the directions of the spontaneous polarization of the ceramic particles can be easily regularized, as schematically illustrated in FIG. 3. Therefore, when the resulting composite is subjected to an electric field for effecting poling, the directions of the spontaneous polarization of the ceramic particles become the same as those of the polarization caused by the electrical field. That is, the directions of the spontaneous polarization of cubic or rectangular parallelepiped particles are highly oriented and can be the same as those of polarization caused when they are applied with direct current voltage. Thus, the particulate lead titanate ceramic according to the present invention exhibits excellent piezoelectric properties and is suitably used as piezoelectric material for underwater acoustic transducers.

Figure 4:
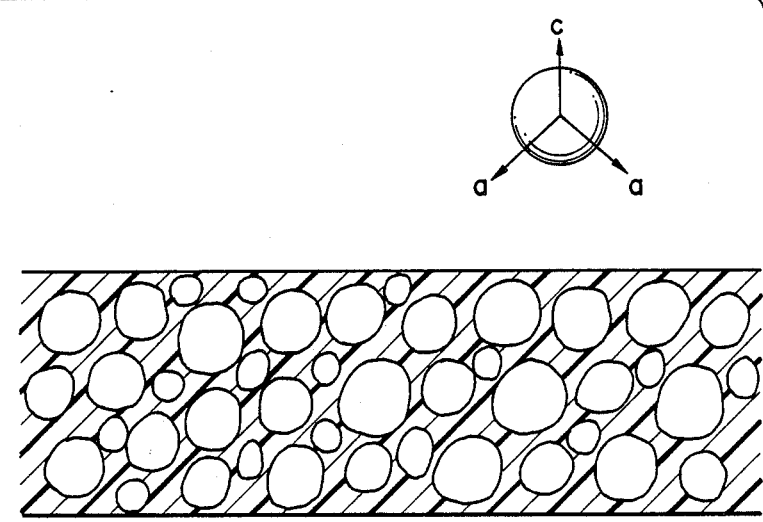
FIG. 4 is a schematic illustration, similar to FIG. 3, showing the configuration of conventional lead titanate powder dispersed in an organic matrix.
Figure 5A:
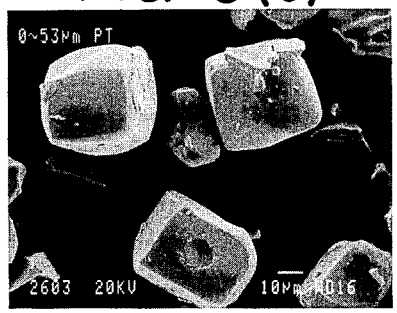
FIGS. 5(a) to 5(f) are scanning electron micrographs of particulate lead titanate ceramics of the present invention.
Figure 5B:
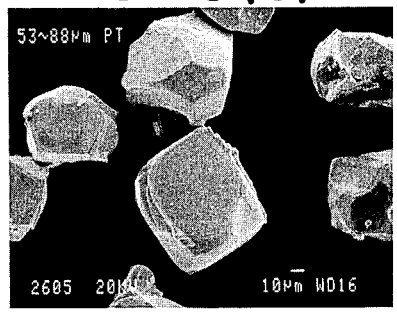
Figure 5C:
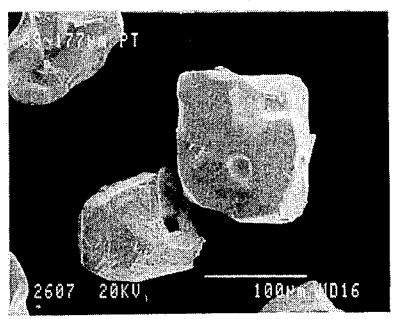
Figure 5D:
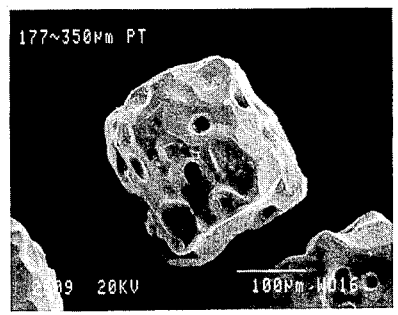
Figure 5E:
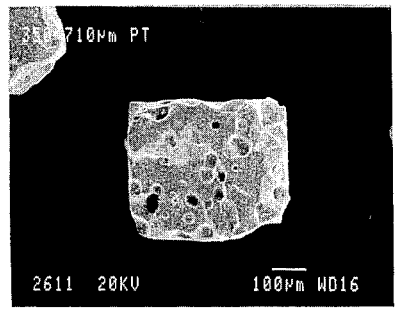
Figure 5F:
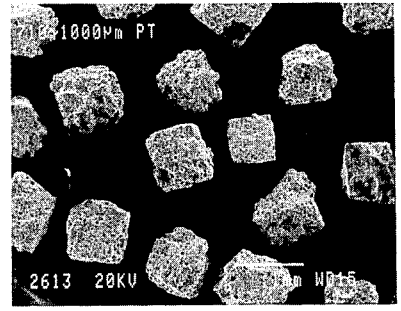

On the other hand, the directions of the spontaneous polarization of the conventional lead titanate powder having indeterminate, various shpaes such as spherical and polyhedral shapes as shown in FIG. 4, are oriented quite at random and, therefore, they do not sufficiently become uniform with directions of polarization caused by the electric field.

The following example will further illustrate the present invention.

EXAMPLE

Preparation of Particulate Lead Titanate Ceramic

Commercially available, aggregate-free PbO having an average particle size of 3 μm or less and rutile type $TiO_2$ having an average particle size of 2 μm or less were mixed with various mixing ratios providing $Pb_{1+x}TiO_{3+x}$ where x was as indicated in Tables 1 and 2. Each mixture (2.5 kg) was then commingled by means of a vibrating mill containing alumina balls for 3 hours under dry conditions. The vibration mill used had a pot whose inside wall was lined with an urethane resin to prevent the inclusion of impurities in the mixture. The resulting admixture was placed in a mold and pressed at a pressure of 280 kg/cm² to obtain tablets each having a diameter of 61 mm and a thickness of 9 mm. The tablets were then heat treated in a high alumina crucible at 1150° C. for 4 hours or at 1250° C. for 2 hours to effect solid phase reaction. The heated mass was then allowed to be spontaneously cooled in air to give particulate lead titanate with particle sizes of 30 μm to 1.5 mm and particle size distributions shown in Tables 1 and 2. Table 1 is for lead titanate particles obtained by the heat treatment at 1150° C. for 4 hours, while Table 2 is at 1250° C. for 2 hours.

From the results shown in Tables 1 and 2, it is seen that the greater the excess amount of PbO, the larger becomes the particle size of the lead titanate particles.

Figure 6:
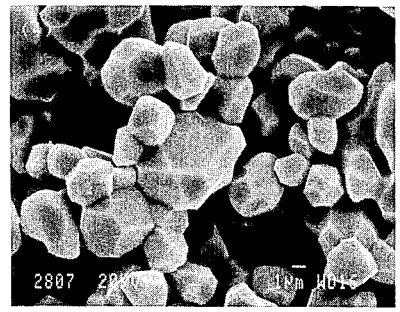
FIG. 6 is a scanning electron micrograph of conventional lead titanate powder.

The particulate lead titanate ceramic shown in Table 2 with the excess amount of PbO of 2.0 wt % (x=0.0280) was measured for scanning electron micrographs separately for respective particle sizes. The results are shon in FIG. 5(a) (0–53 μm), 5(b) (53–88 μm), 5(c) (88–177 μm), 5(d) (177–350 μm), 5(e) (350–710 μm), and 5(f) (710–1000 μm). For the purpose of comparison, the scanning electron micrograph of the conventional lead titanate (x=0) shown in Table 1 is shown in FIG. 6. The particulate lead titanate ceramic and the conventional lead titanate powder were also measured for X-ray diffraction and its orientation analyzed. The X-ray diffraction patterns of the samples of FIGS. 5(a) through 5(f) and FIG. 6 are shown in FIGS. 1(a) through 1(f) and FIG. 2, respectively. The degrees of orientation are shown in Table 3.

The diffraction patterns were obtained by standard X-ray techniques. The radiation was the K-alpha doublet of copper. The peak intensity I was recorded as a function of 2θ, where θ is the Bragg angle.

TABLE 1

(Heat-treated at 1150° C. for 4 hours)

| Excess amount of PbO (wt %)* | $Pb_{1+x}TiO_{3+x}$ x | Particle Size Distribution (wt %) | | | |
|---|---|---|---|---|---|
| | | 0–25 μm | 25–53 μm | 53–88 μm | 88–105 μm |
| 1.0 | 0.0140 | 28.9 | 37.2 | 32.9 | 1.0 |
| 2.0 | 0.0280 | 15.8 | 45.5 | 36.6 | 2.1 |
| 5.0 | 0.0700 | 8.6 | 40.2 | 42.8 | 8.4 |
| 0 | 0 | 100 (0–14 μm) | | | |

*Excess amount of PbO = $\dfrac{M_1}{M_1 + M_2} \cdot x \, (\times 100\%)$ where $M_1$ and $M_2$ represent the molecular weight of PbO and $TiO_2$, respectively.

TABLE 2

(Heat-treated at 1250° C. for 2 hours)

| Excess amount of PbO (wt %) | Pb1 + xTiO3 + x x | Particle Size Distribution (wt %) | | | | | |
|---|---|---|---|---|---|---|---|
| | | 0–53 μm | 53–88 μm | 88–177 μm | 177–350 μm | 350–710 μm | 710–1000 μm |
| 1.0 | 0.0140 | 3.7 | 8.9 | 47.6 | 23.2 | 16.6 | — |
| 2.0 | 0.0280 | 1.5 | 5.3 | 41.5 | 29 | 20.5 | 2.0 |
| 5.0 | 0.0700 | 1.0 | 2.0 | 30.7 | 38 | 23.3 | 5.0 |

TABLE 3

| | Conventional Lead Titanate | Inventive Lead Titanate | | | | | |
|---|---|---|---|---|---|---|---|
| Particle Size (μm) | 0–14 | 0–53 | 53–88 | 88–177 | 177–350 | 350–710 | 710–1000 |
| Degree of Orientation | 0.34 | 0.52 | 1.58 | 4.45 | 24.0 | 42.8 | 76.0 |

The degree of orientation (D) is a ratio of the total of the intensities of diffraction in planes [h00] and [00l] to the total of the intensities of diffraction in the other planes and is obtained from the following equation:

$$D = \frac{\Sigma I[h00] + \Sigma I[00l]}{\Sigma I[hkl] + \Sigma I[hk0] + \Sigma I[h0l]}$$

where h, k and l =0 and 20°≦2θ≦70°.

Figure 1A:
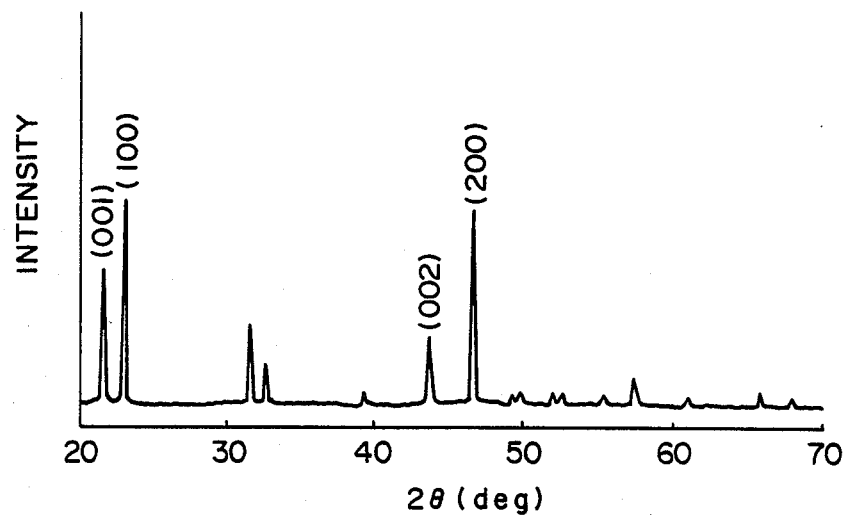
FIGS. 1(a) through 1(f) are X-ray diffraction patterns of particulate lead titanate ceramics according to the present invention.
Figure 1B:
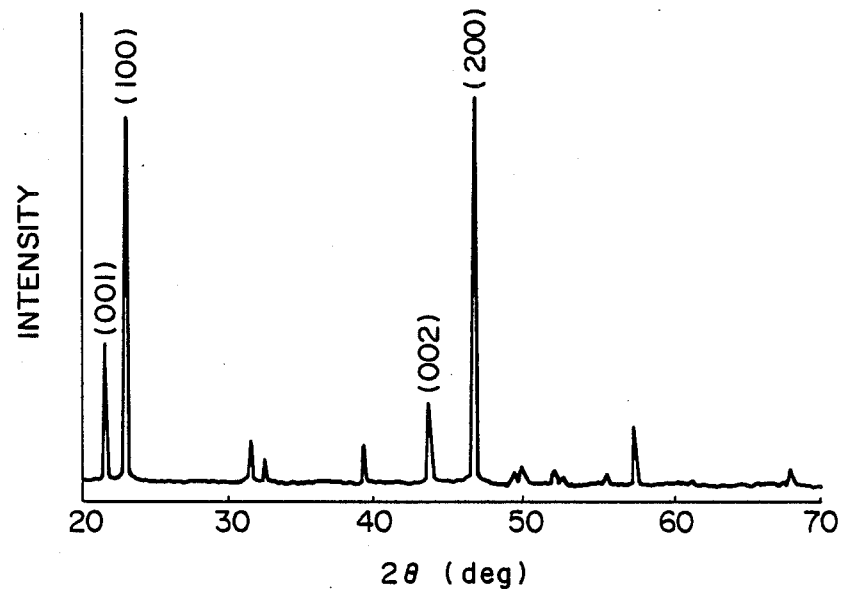
Figure 1C:
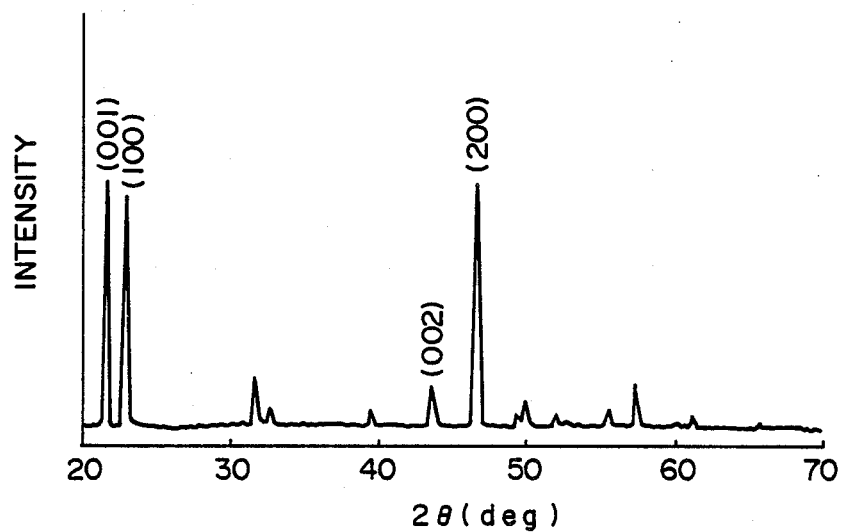
Figure 1D:
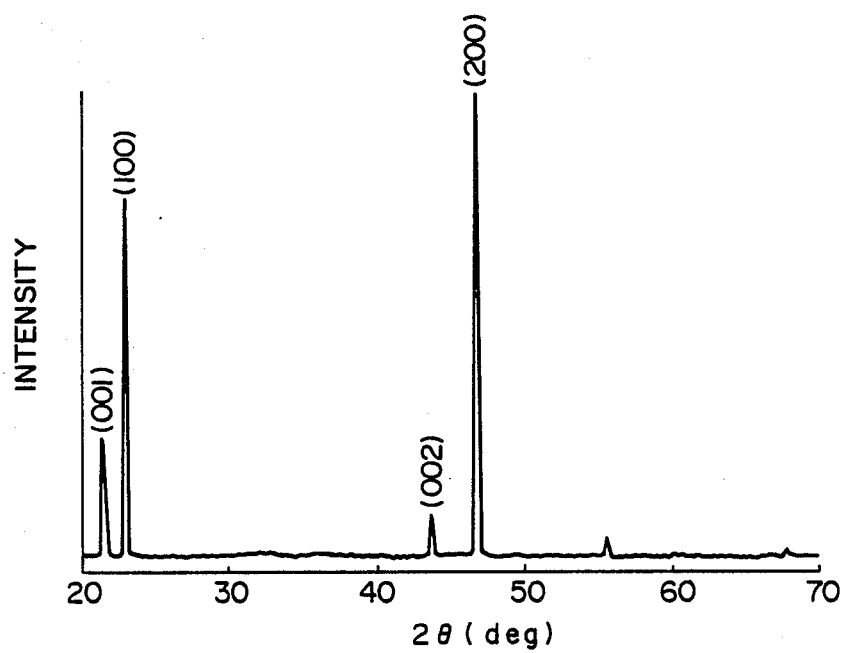
Figure 1E:
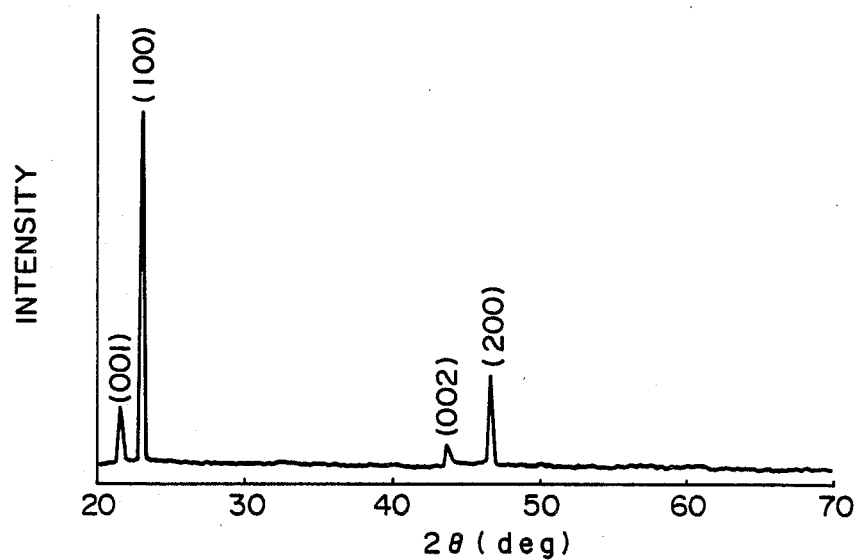
Figure 1F:
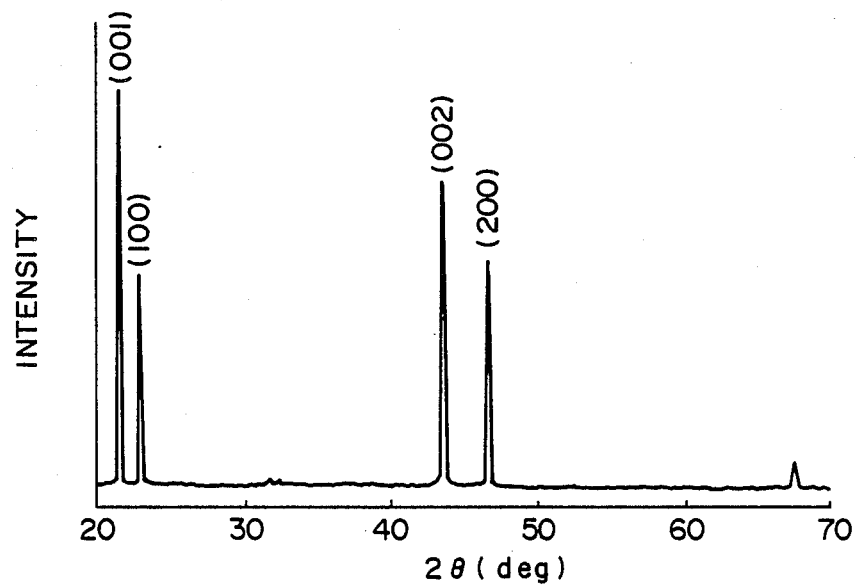
Figure 2:
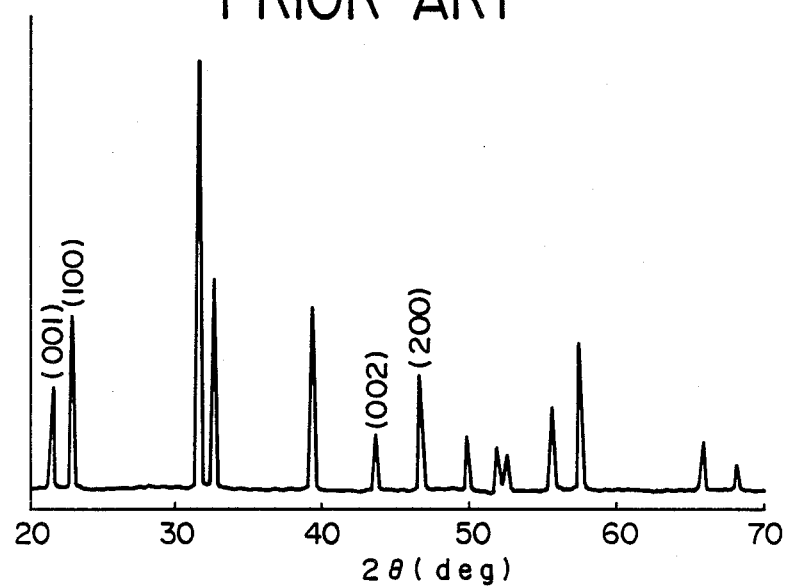
FIG. 2 is an X-ray diffraction pattern of conventional lead titanate powder.

As seen in the X-ray diffraction patterns shown in FIG. 2, the conventional lead titanate powder gives strong diffraction lines belonging to the planes other than a-plane and c-plane. Such diffraction lines disappear or are markedly weakened in the case of the particulate lead titanate ceramics according to the present invention as shown in FIGS. 1(a) through 1(f). The results shown in Table 3 indicate that the particulate lead titanate of the present invention have a significantly higher degree of orientation as compared with the conventional lead titanate. This property makes it easy to effect poling and serves to improve the piezoelectric properties of composite materials as described hereinafter.

Preparation of Composite Materials

The particulate lead titanate ceramics shown in Table 2 and having particle sizes of 0–53 μm and 53–88 μm were used for the preparation of composite materials according to the present invention. For the purpose of comparison, the conventional lead titanate shown in Table 1 was also prepared in the same manner. The ceramic (60 vol %) was mixed wih an epoxy resin gel (40 vol %) and the mixture was commingled for more than 1 hour with an agitator. The mixture was then poured into a mold and was cured at a temperature of 120° C. and a pressure of 90 kg/cm² for 90 minutes while continuously applying a uniaxial stress by means of a vulcanizing press machine, thereby obtaining a rectangular sheet with a thickness of 2 mm.

Through the pressing treatment, the ceramic particles dispersed in the epoxy resin gel are uniformly oriented in the direction parallel to the plane of the sheet even when their c-axes were initially oriented at random, e.g. obliquely. Thus, the degree of orientation is further improved. Therefore, the directions of the spontaneous polarization may become uniform after a poling treatment.

The thus obtained sheets were cut to a square of 150 mm×150 mm and applied on both sides with a silver paste to form electrodes. The resulting sheets were immersed in an insulating liquid and applied continuously with a 100 KV/cm direct current voltage at 20° C. for 1 hour to effect poling. The resulting piezoelectric composite sheets were each used as a piezoelectric element of a hydrophone and tested for piezoelectric properties $d_h \times g_h$, $M_v$ and $\epsilon$. The results are shown in Table 4.

The piezoelectric constants $d_h$ and $g_h$ were measured with a frequency of 40 Hz and the wave receiving sensitivity Mv was determined on the basis that 0 dB=1 V/μPa. The tests were carried out 100 days after the poling treatment so that the measured values represent stabilized characteristics of the test samples.

TABLE 4

|                    | Conventional | Inventive |         |
| ------------------ | ------------ | --------- | ------- |
| Particle size (μm) | 0–14         | 0–53      | 53–88   |
| dhxgh              | 7000         | 16058     | 23300   |
| Mv                 | −193         | −188.7    | −186.1  |
| E                  | 48           | 43.2      | 38.8    |

From the results shown in Table 4, it is evident that the particulate lead titanate according to the present invention having a larger particle size (having more developed c-axes) than the conventional lead titanate powder gives composite materials having both improved piezoelectric constants and wave receiving sensitivity.

Particulate lead titanate with an excess amount of PbO of 2.0 wt % (X=0.0280) was also prepared in the same manner as described above except that the calcination was conducted at a temperature of 1280° C. for 2 hours. The lead titanate ceramic having a particle size of about 1.5 mm was obtained. A calcination temperature in excess of 1300° C., however, adversely affects the solid phase reaction and is unsuitable.

Figure 7:
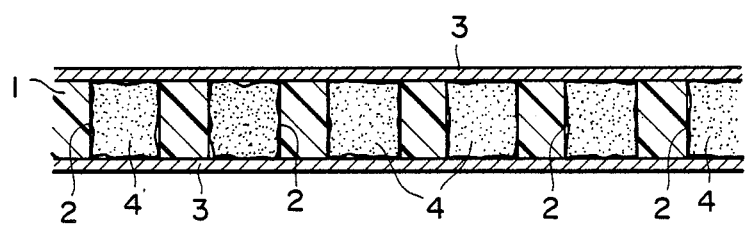
FIG. 7 is a sectional view diagrammatically showing one embodiment of composite material according to the present invention.

The particulate lead titanate ceramic of the present invention having a large particle size may be used not only in the form of a homogeneously dispersed state in an organic matrix but also in a mass. One example of the latter case is shown in FIG. 7, in which an organic substrate 1 such as a synthetic rubber is in the form of a sheet. The substrate 1 has one or more openings 2 such as through-holes or rows of slits distributed, generally uniformly, in the substrate 1. In each opening 2 is packed a mass of the particulate lead titanate ceramic 4. An electrode is mounted on each side of the substrate 1. Alternatively, the lead titanate ceramic particles may be bonded with each other with an adhesive to form a layer of the ceramic, on both sides of which are provided electrode layers. The particulate lead titanate ceramic of the present invention can be supported in any other various suitable manner to form composite materials for use as underwater acoustic transducers, piezoelectric sensors for detecting conditions of metal surfaces, pyroelectric materials for infra-red ray detectors, etc.

The invention may be embodied in other specific forms without departing from the spirit or essential charcteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A dielectric particulate lead ceramic composition consisting essentially of rectangular parallelepiped particles having the formula $Pb_{1+x}TiO_{3+x}$, wherein x is from 0.01 to 0.08.

2. A dielectric composition according to claim 1, wherein said particles are larger than 14 μm in size.

3. A dielectric composition according to claim 2, wherein said particles are about 14 to about 1000 μm in size.

4. A dielectric composition according to claim 3, wherein said particles are about 14 to about 88 μm in size.

5. A dielectric composition according to claim 1, wherein said particles have an x-ray diffraction pattern with more than 0.34 degrees of orientation.

6. A dielectric composition according to claim 1, wherein said particles have an x-ray diffraction pattern with about 0.34 to about 0.76 degrees of orientation.

7. A dielectric composition according to claim 5, wherein said particles are about 14 to about 88 μm in size, and wherein said particles have an x-ray diffraction pattern with about 0.52 to about 76.0 degrees of orientation.

8. A dielectric composition according to claim 1, wherein said particles are obtained by calcining a mixture of PbO and $TiO_2$ having 1.01 to 1.08 moles of PbO for each mole of $TiO_2$ at a temperature of from 1150 to 1300 degrees C.

9. A dielectric composition according to claim 4, wherein said particles are obtained by calcining a mixture of PbO and $TiO_2$ having 1.01 to 1.08 moles of PbO for each mole of $TiO_2$ at a temperature of from 1150 to 1300 degrees C.

10. A dielectric composition according to claim 6, wherein said particles are obtained by calcining a mixture of PbO and $TiO_2$ having 1.01 to 1.08 moles of PbO for each mole of $TiO_2$ at a temperature of from 1150 to 1300 degrees C.

11. A dielectric composition according to claim 7, wherein sid particles are obtained by calcining a mixture of PbO and $TiO_2$ having 1.01 to 1.08 moles of PbO for each mole of $TiO_2$ at a temperature of from 1150 to 1300 degrees C.

12. A particulate lead composite material comprising an organic matrix, and
a particulate lead ceramic composition consisting essentially of rectangular parallelepiped particles having the formula $Pb_{1+x}TiO_{3+x}$, wherein x is from 0.01 to 0.08, and wherein said particles are substantially homogeneously dispersed in said matrix and are uniformly aligned in substantially the same direction.

13. A composite material according to claim 12, wherein said direction is the same as the direction of spontaneous polarization of said particles.

14. A composite material according to claim 13, wherein said organic matrix is an epoxy resin comprising about 40% of the composite material by volume.

15. A composite material according to claim 12, wherein said composite is in the form of a flat sheet and said direction is parallel to the plane of said sheet.

16. A particulate lead composite material comprising an organic matrix in the form of a flat sheet and having one or more openings therein, and a particulate lead ceramic composition consisting essentially of rectangular parallelepiped particles having the formula $Pb_{1+x}TiO_{3+x}$, wherein x is from 0.01 to 0.08, and wherein said particles are disposed within said one or more openings and are aligned in substantially the same direction.

17. A particulate lead composite material comprising an organic matrix, and a particulate lead ceramic composition consisting essentially of rectangular parallelepiped particles having the formula $Pb_{1+x}TiO_{3+x}$, wherein x is from 0.01 to 0.08, and wherein said particles are substantially homogeneously dispersed on and bonded to at least one surface of said matrix and are uniformly aligned in substantially the same direction.

* * * * *